United States Patent [19]
Harzer

[11] Patent Number: 4,514,705
[45] Date of Patent: Apr. 30, 1985

[54] LOW-NOISE DIGITALLY TUNABLE PHASE-LOCKED LOOP FREQUENCY GENERATOR

[75] Inventor: Peter Harzer, Eningen, Fed. Rep. of Germany

[73] Assignee: Wandel & Goltermann GmbH & Co. KG, Eningen, Fed. Rep. of Germany

[21] Appl. No.: 328,656

[22] Filed: Dec. 8, 1981

[30] Foreign Application Priority Data

Dec. 10, 1980 [DE] Fed. Rep. of Germany ....... 3046486

[51] Int. Cl.³ .......................... H03L 7/08; H03L 7/18
[52] U.S. Cl. ......................................... 331/2; 331/10; 331/11; 331/16; 331/17
[58] Field of Search .................... 331/2, 10, 11, 16, 17

[56] References Cited

U.S. PATENT DOCUMENTS

| 3,840,822 | 10/1974 | Hoffmann | 331/16 |
| 3,872,397 | 3/1975 | Hanneman | 331/1 A |
| 3,875,524 | 4/1975 | Harzer et al. | 331/1 A |
| 3,956,703 | 5/1976 | Noordanus et al. | 328/14 |
| 4,191,930 | 3/1980 | Harzer | 331/1 A |
| 4,318,055 | 3/1982 | Hopwood et al. | 331/12 |

FOREIGN PATENT DOCUMENTS 112044  8/1980  Japan ........................ 331/2

Primary Examiner—Eugene R. LaRoche
Assistant Examiner—D. C. Mis
Attorney, Agent, or Firm—Karl F. Ross; Herbert Dubno

[57] ABSTRACT

A variable-frequency main oscillator of digitally tunable high output frequency $f_A$ is controlled by the integrated output voltage of a phase discriminator receiving on the one hand a relatively low comparison frequency and on the other hand a matching feedback frequency stepped down from output frequency $f_A$ by frequency division or by heterodyning with an auxiliary frequency $f_H$ of the same order of magnitude from an ancillary oscillator, a difference frequency $f_D = f_A - f_H$ is fed to a frequency discriminator delivering a corrective voltage, independent of that emitted by the phase discriminator through a filter network, to the control input of the main oscillator. A pair of frequency selectors varying the feedback frequency and/or the comparison frequency enable the output frequency $f_A$ to be adjusted in coarse and fine tuning steps, the coarse adjustments being also applied to the auxiliary frequency $f_H$ to limit the excursions of the difference frequency $f_D$. In order to minimize shifts in the corrective voltage due to changes in the setting of the fine-tuning selector, a digital command generated by that selector is converted into an analog compensating voltage subtracted from the output voltage of the frequency discriminator.

13 Claims, 4 Drawing Figures

LOW-NOISE DIGITALLY TUNABLE PHASE-LOCKED LOOP FREQUENCY GENERATOR

FIELD OF THE INVENTION

My present invention relates to a digitally tunable frequency generator and to a method of operation for same in order to suppress noises due to switching transients and the like.

BACKGROUND OF THE INVENTION

Frequency generators of the digitally settable type have been described, inter alia, in commonly owned U.S. Pat. Nos. 3,840,822, 3,875,524 and 4,191,930. As particularly disclosed in U.S. Pat. No. 3,840,822, for example, a main high-frequency oscillator can be provided with a phase-locking loop including a phase comparator or discriminator receiving on a first input a relatively low reference frequency and on a second input a matching feedback frequency derived from the output frequency of the main oscillator through a step-down circuit including several cascaded frequency dividers. The phase comparator works into a control input of the main oscillator through a nonlinear impedance path, specifically a shunt capacitor and a series resistor flanked by two antiparallel diodes, establishing a time constant which varies inversely with the output voltage of the phase comparator and thus sets a low limiting frequency for the correction of small phase differences. This is desirable, as explained in the prior patent referred to, in order to enable rapid coarse tuning of the main oscillator while minimizing the fluctuation of an output frequency due to the insertion or suppression of spikes in a train of such spikes emitted by that oscillator.

The large time constant of the filter network in its high-ohmic state has the drawback, however, of failing to compensate for phase differences resulting from frequency deviations smaller than the increments used for coarse tuning. Such a frequency instability or noise is objectionable in an oscillation generator which is to be finely tunable by small interpolation steps, especially by the subharmonic insertion or suppression of spikes as taught in the commonly owned prior patents.

OBJECTS OF THE INVENTION

An object of my prevent invention, therefore, is to provide a method of suppressing such noise in the output of an oscillation generator whose frequency is to be digitally adjusted, manually or under the control of a scanner, in discrete steps.

A related object is to provide a system implementing that method.

SUMMARY OF THE INVENTION

My invention is applicable to a digitally tunable high-frequency oscillator whose output frequency $f_A$ is controlled by a phase discriminator such as the one disclosed in U.S. Pat. No. 3,840,822, i.e. with a filter network whose limiting frequency varies monotonically with the output voltage of that discriminator. The latter receives a relatively low comparison frequency from a reference source and a matching feedback frequency stepped down from its output frequency, either or both of the frequencies fed to the phase discriminator being adjustable for varying the output frequency $f_A$ in coarse and fine increments. In accordance with my present invention, an auxiliary frequency $f_H$ of the same order of magnitude as the output frequency $f_A$ is generated and is modified by the same coarse increments as frequency $f_A$; a continuously produced difference frequency $f_D = f_A - f_H$ gives rise to a corrective voltage which is fed to a control input of the high-frequency oscillator in addition to the output voltage of the phase discriminator.

A system according to my invention, designed to carry out this method, includes first selection means coupled to one input of the phase discriminator for modifying the frequency applied thereto in coarse-tuning steps corresponding to relatively large increments of frequency $f_A$, second selection means coupled to one of the inputs of the phase discriminator for modifying the frequency applied thereto in fine-tuning steps corresponding to relatively small increments of frequency $f_A$, and an ancillary oscillator emitting the aforementioned auxiliary frequency $f_H$. The ancillary oscillator has a phase-locking loop including control means coupled with the first selection means for varying the auxiliary frequency $f_H$ in the same relatively large increments as the output frequency $f_A$, both these frequencies being fed to mixer means generating the difference frequency $f_D$. A frequency discriminator converts this difference frequency $f_D$ into a corrective voltage fed via suitable circuit means, preferably including a blocking capacitor in series with a resistor, to the control input of the main oscillator via an impedance path bypassing the filter network in order to suppress noises due to phase differences which vary at frequencies beyond the limiting frequency of that network.

In order to minimize the effect of voluntary adjustments of the output frequency by fine tuning upon the corrective voltage emitted by the frequency discriminator, that corrective voltage may be diminished ahead of the aforementioned blocking capacitor by a compensating voltage represented by the setting on the corresponding selector.

BRIEF DESCRIPTION OF THE DRAWING

The above and other features of my invention will now be described in detail with reference to the accompanying drawing in which.

SPECIFIC DESCRIPTION

Figure 1:
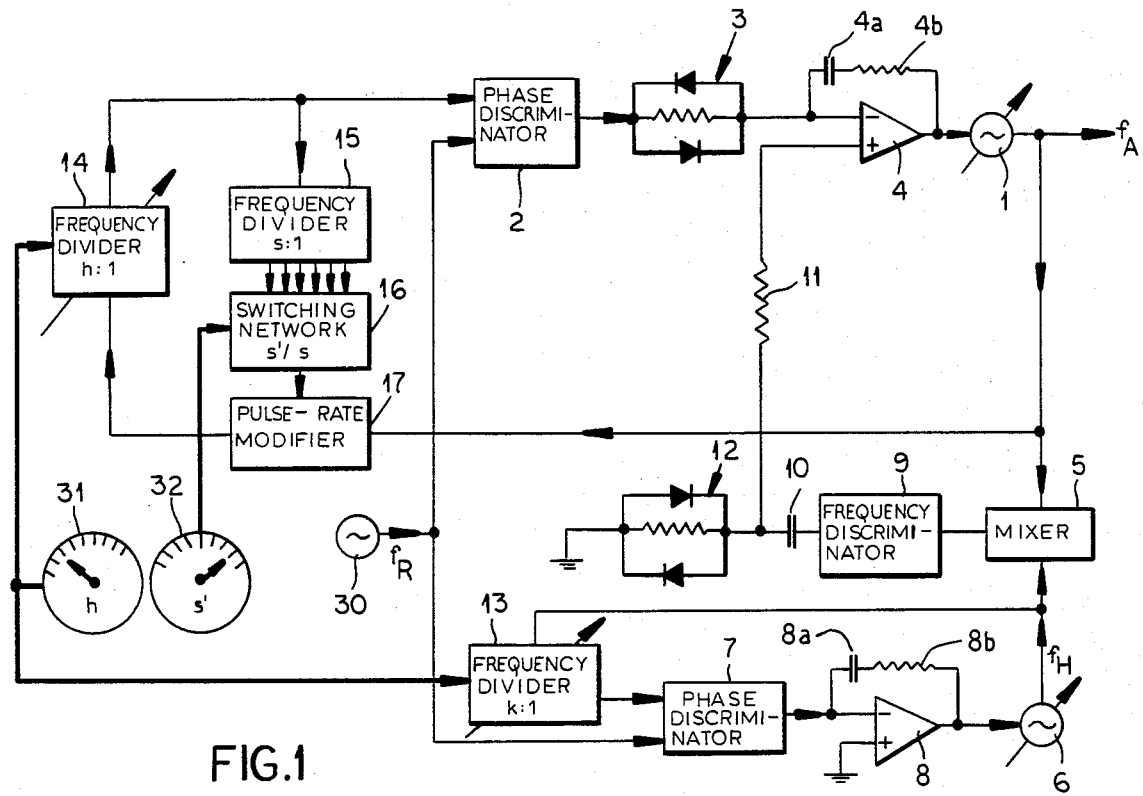
FIG. 1 is a circuit diagram of a low-noise digitally tunable phase-locked loop frequency generator embodying the invention.

FIG. 1 shows a main high-frequency oscillator 1 adjustable within an operating range of, say, 40 to 65 MHz by a voltage applied to a control input thereof from the output of a phase discriminator 2 via a filter network 3 and an operational amplifier 4 in series therewith. Amplifier 4, acting as an integrator, has a capacitor 4a and a resistor 4b inserted in the usual manner between its output and its inverting input connected to filter network 3. That network, having a resistor shunted by two antiparallel diodes, is of the type disclosed in the aforementioned commonly owned U.S. Pat. No. 3,840,822, except that feedback capacitor 4a plays the part of the shunt capacitor shown in the prior patent.

Components 2, 3 and 4 form part of a phase-locking loop in which the output frequency $f_A$ of oscillator 1 is stepped down by a frequency divider 14 before being fed to one input of phase discriminator 2 whose other input receives a constant comparison frequency. The latter, in the present instance, is a reference frequency $f_R$ from a stabilized source such as a crystal-controlled oscillator 30; frequency $f_R$ is low in comparison with frequency $f_A$, e.g. of 100 KHz or 1 MHz. Frequency divider 14, whose step-down ratio h:1 is adjustable by means of a selector 31 designed to tune the oscillator 1 in relatively large frequency increments, lies in series with a pulse-rate modifier 17 of the type described in the several commonly owned prior patents identified above. Modifier 17, which receives the output frequency $f_A$ in the form of a train of sharp spikes, is controlled by a switching network 16 settable by another selector 32 designed to adjust the frequency $f_A$ in relatively small increments which are subharmonically and preferably decadically related to the large increments settable by selector 31. Switching network 16 has inputs connected to several stage outputs of a frequency divider 15 having a fixed step-down ratio s:1 (s being advantageously a power of 10) and lying in cascade with divider 14 to which it is connected ahead of phase discriminator 2. Selector 32 may set the network 16 to pass any number s' of output pulses of divider 14, ranging from zero through s−1, during a cycle of s output pulses, to a subtracting input of pulse-rate modifier 17 so as to suppress a corresponding number of spikes in the input of that divider. It can be shown that, with this arrangement, the output frequency of oscillator 1 will have a value $$f_A = f_R \cdot \left( h + \frac{s'}{s} \right),$$

with h and s' independently selectable by devices 31 and 32. It should be noted that these devices may be manually settable but could also be operated automatically for progressingly varying or "wobbling" the output frequency $f_A$.

An ancillary oscillator 6, also preferably of the crystal-controlled type, emits an auxiliary frequency $f_H$ of the same order of magnitude as frequency $f_A$ and variable in the same coarse steps under the control of selector 31. For this purpose, oscillator 6 has a phase-locking loop including a frequency divider 13 working into one input of a phase discriminator 7 whose other input receives the reference frequency $f_R$ from generator 30. The output voltage of phase discriminator 7 is transmitted to the control input of oscillator 6 via an integrating operational amplifier 8 provided with a feedback capacitor 8a and a feedback resistor 8b. Divider 13 has a step-down ratio slightly different from that of divider 14, namely k:1 where $k = h - n$, n being a small integer such as 2.

A mixer 5 receiving the two frequencies $f_A$ and $F_H$ emits a difference frequency $f_D$ ranging between $nf_R$ and $(n+1)f_R$ which is thus of the same order or magnitude as the comparison frequency $f_R$ representing the width of a coarse-tuning step by which the output frequency $f_A$ can be adjusted with the aid of selector 31. Difference frequency $f_D$ is fed to a frequency discriminator 9 whose output is connected via a blocking capacitor 10 and a series resistor 11 to the noninverting input of operational amplifier 4 so that changes in that frequency, reflecting fluctuations of output frequency $f_A$, give rise to a corrective voltage transmitted to the control input of oscillator 1. A threshold device 12, similar to filter network 3, lies between ground and the junction of impedance elements 10, 11 so as to limit the magnitude of this corrective voltage, e.g. for preventing overcorrection in the event of a denominational carry by which a change in the coarse-tuning coefficient h is accompanied by a jump in the fine-tuning coefficient s'.

The use of a low difference frequency $f_D$ amplifies the fluctuations of output frequency $f_A$, and thus of the output voltage of frequency discriminator 9, so that a relatively small capacitor 10 can be employed for blocking the d-c component of this voltage.

Figure 2:
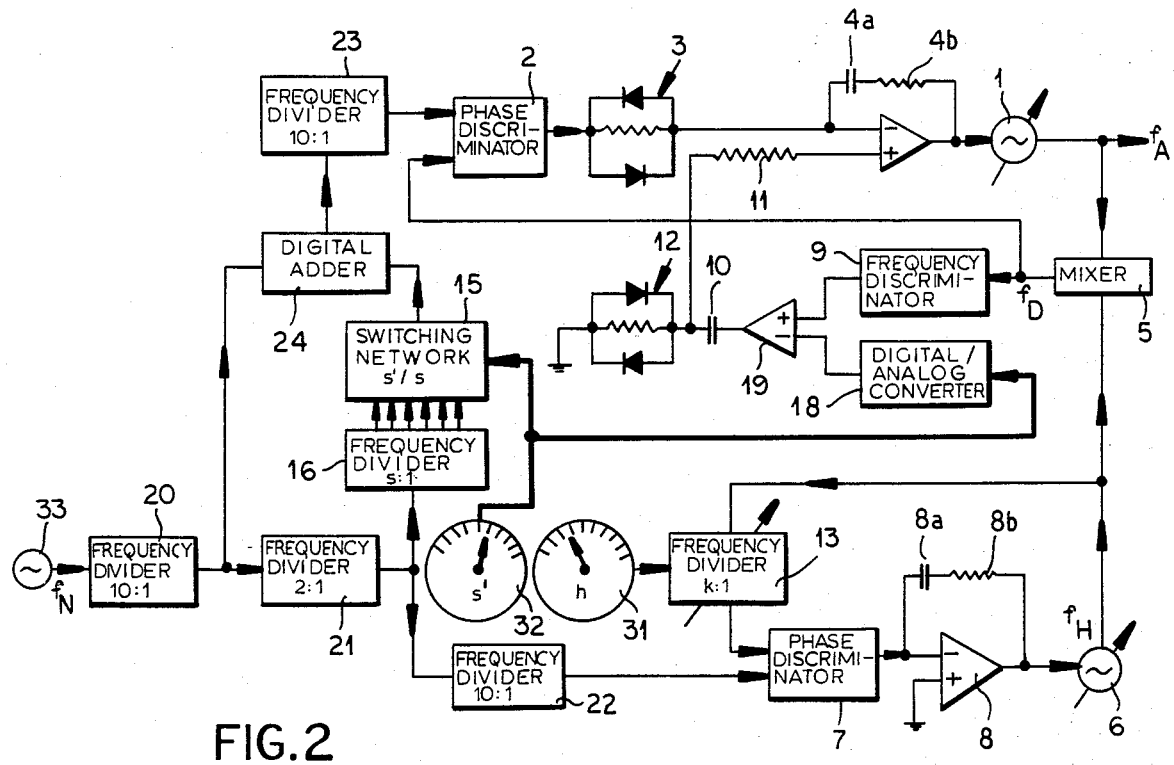
FIG. 2 is a circuit diagram of another embodiment of the invention utilizing a differential amplifier in addition to the frequency discriminator in the circuit of FIG. 1.
Figure 3:
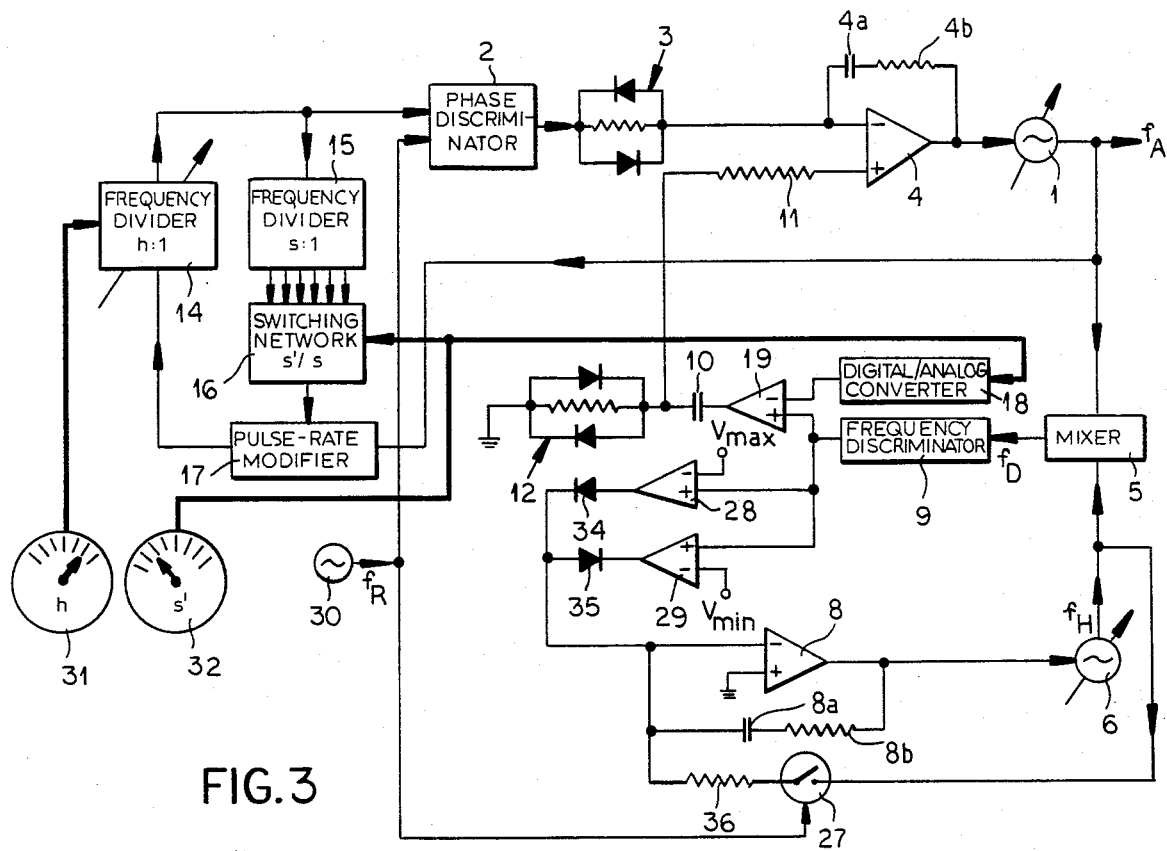
FIG. 3 is a circuit diagram of yet another embodiment of the invention utilizing a sampling gate.
Figure 4:
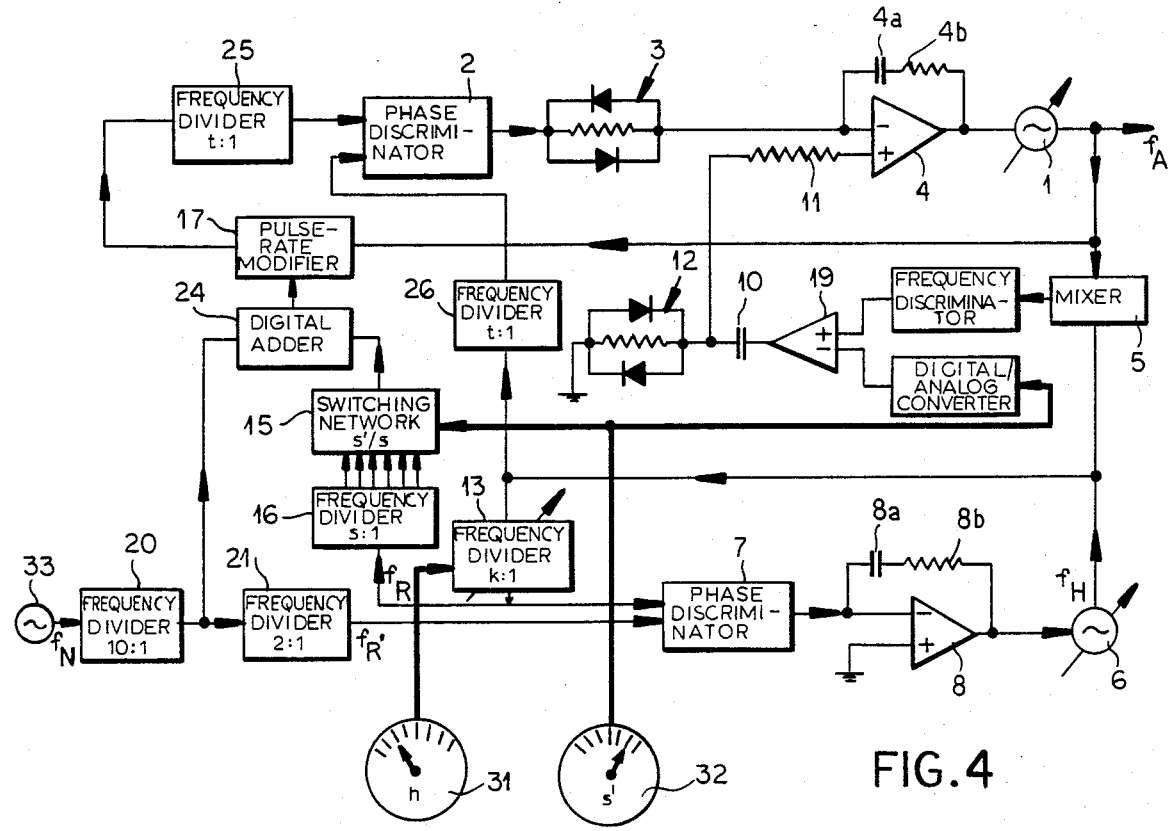
FIG. 4 is a circuit diagram of a fourth embodiment of the invention combining features of the embodiments of FIGS. 1 and 2.

As illustrated in FIGS. 2–4 described hereafter, the effect of fine tuning upon the corrective voltage delivered to the noninverting input of amplifier 4 can be further reduced (theoretically fully eliminated) by the interposition of a subtractor 19 such as a differential amplifier between discriminator 9 and capacitor 10, an inverting input of the subtractor being connected to the output of a digital/analog converter 18 receiving from selector 32 the same binary-coded setting command that establishes the value s' in switching network 15.

The system of FIG. 2 further differs from that of FIG. 1 in that the phase-locking loop of oscillator 1 includes the mixer 5 so that difference frequency $f_D$ is used as the stepped-down feedback frequency applied to one input of phase discriminator 2. The other input of this phase discriminator receives a comparison frequency which is derived from a stabilized normal frequency $f_N$, produced by a preferably crystal-controlled oscillator 33, with the aid of two cascaded frequency dividers 20, 23 of fixed step-down ratio 10:1 and an interposed digital adder 24. Another frequency divider 21 in cascade with divider 20, having a step-down ratio of 2:1, feeds the frequency divider 16 of step-down ratio s:1 working into the switching network 15 controlled by selector 32; the output of network 15 is fed to another input of adder 24 acting as a summing rather than a subtracting pulse-rate modifier. A further frequency divider 22 of fixed step-down ratio 10:1 lies in cascade with divider 21 and supplies the reference frequency $f_R$ to phase discriminator 7 in the phase-locking loop of ancillary oscillator 6; the other input of discriminator 7 receives the $k^{th}$ fraction of auxiliary frequency $f_H$ via frequency divider 13 controlled by selector 31.

With the step-down ratios specified, adder 24 receives from divider 20 a pulse train of cadence $20f_R$ and from network 15 up to s−1 supplemental pulses for every 2s pulses of that train so that the pulse sequence fed by divider 23 to phase discriminator 2 will have a cadence ranging between $2f_R$ and $3f_R$, depending on the setting of selector 32. Since frequency divider 13 establishes the auxiliary frequency $f_H$ at a selected value $kf_R$, output frequency $f_A$ must exceed the auxiliary frequency $f_H$ by a difference frequency $f_D$ equaling that cadence in steady-state operation. Thus, oscillator 1 will again be tunable by selector 31 in coarse steps of magnitude $hf_R$ with $h = k + 2$.

In FIG. 3 the phase-locking loop of the main oscillator 1 is identical with that of FIG. 1, including the same components 2, 3, 4, 14 and 17. The phase discriminator 7 in the phase-locking loop of ancillary oscillator 6, however, has been replaced by a sampling gate 27 which is periodically closed at cadence $f_R$ by the output pulses of generator 30 and is connected via a resistor 36 to the inverting input of operational amplifier 8. The output voltage of frequency discriminator 9 is also fed in this instance to a source of upper and lower presetting voltages $V_{max}$ and $V_{min}$ for the control input of oscillator 6, namely differential amplifiers 28 and 29 connected to amplifier 8 by way of oppositely poled diodes 34 and 35, respectively.

As long as the auxiliary frequency $f_H$ deviates from output frequency $f_A$ by a difference frequency $f_D > f_R$, amplifier 28 or 29 conducts to bring the oscillator 6 into the proper operating range. Once that range is established, minor fluctuations of frequency $f_H$ will cause voltage changes on the inverting input of amplifier 8 whereby oscillator 6 is immediately reset to the proper value.

The system shown in FIG. 4 combines features of FIGS. 1 and 2, the phase-locking loop of its main oscillator 1 differing from that of FIG. 1 by the replacement of adjustable frequency divider 14 with a frequency divider 25 of fixed step-down ratio t:1. The pulse-rate modifier 17 in that loop is controlled, as in FIG. 2, by a digital adder 24 receiving a pulse train of constant cadence from frequency divider 20 and possible supplemental pulses from switching network 15. Frequency divider 13 in the phase-locking loop of ancillary oscillator 6, again having a variable step-down ratio of k:1, works not only into phase discriminator 7 but also into frequency divider 16 which in the balanced state of the loop receives the reference frequency $f_R$. A further frequency divider 26, of the same step-down ratio t:1 as divider 25, feeds a comparison frequency equal to a fraction of auxiliary frequency $f_H$ to the first input of phase discriminator 2. The input of divider 16 could obviously be connected, as in FIG. 2, to the output of stage 21 which in the balanced condition also carries the reference frequency here designated $f_R$. The operation of this system is similar to that described above with reference to FIG. 2.

I claim:

1. A method of suppressing noises in the output of a digitally tunable high-frequency oscillator whose output frequency $f_A$ is controlled via a filter network by a phase discriminator receiving a relatively low comparison frequency from a reference source and a matching feedback frequency stepped down from said output frequency $f_A$, at least one of the frequencies fed to said phase discriminator being adjustable for varying said output frequency $f_A$ in coarse and fine increments, comprising the steps of:

generating an auxiliary frequency $f_H$ of the same order of magnitude as said output frequency $f_A$;
modifying said auxiliary frequency $f_H$ by the same coarse increments as said frequency $f_A$;
continuously producing a difference frequency $f_D = f_A - f_H$; and
feeding a corrective voltage dependent on said difference frequency $f_D$ to a control input of said high-frequency oscillator over a path bypassing said filter network for suppressing noises due to phase differences occurring at said filter network and varying at frequencies beyond a limiting frequency of said filter network, said corrective voltage being fed to said control input through a blocking capacitor, comprising the further step of diminishing said corrective voltage ahead of said blocking capacitor by a compensating voltage proportional to a fine-increment adjustment of said output frequency $f_A$.

2. A method of suppressing noises in the output of a digitally tunable high-frequency oscillator whose output frequency $f_A$ is controlled via a filter network by a phase discriminator receiving a relatively low comparison frequency from a reference source and a matching feedback frequency stepped down from said output frequency $f_A$, at least one of the frequencies fed to said phase discriminator being adjustable for varying said output frequency $f_A$ in coarse and fine increments, comprising the steps of:

generating an auxiliary frequency $f_H$ of the same order of magnitude as said output frequency $f_A$;
modifying said auxiliary frequency $f_H$ by the same coarse increments as said frequency $f_A$;
continuously producing a difference frequency $f_D = f_A - f_H$; and
feeding a corrective voltage dependent on said difference frequency $f_D$ to a control input of said high-frequency oscillator over a path bypassing said filter network for suppressing noises due to phase differences occurring at said filter network and varying at frequencies beyond a limiting frequency of said filter network, said difference frequency $f_D$ being used as said feedback frequency.

3. A system for generating a digitally tunable high-frequency oscillation, comprising:

a main oscillator having a control input and an output terminal for producing a high output frequency $f_A$;
a first phase-locking loop connected between said output terminal and said control input;
a phase discriminator in said phase-locking loop with a first input connected to a source of a relatively low comparison frequency, a second input connected to said output terminal via a step-down circuit converting said output frequency $f_A$ into a feedback frequency matching said comparison frequency, and a voltage output connected to said control input via a filter network whose limiting frequency varies monotonically with the output voltage of said phase discriminator;
first selection means coupled to one of the inputs of said phase discriminator through a frequency divider for modifying the frequency applied thereto in coarse-tuning steps corresponding to relatively large increments of said output frequency $f_A$;
second selection means coupled through a switching network and said frequency divider to one of the inputs of said phase discriminator for modifying the frequency applied thereto in fine-tuning steps corresponding to relatively small increments of said output frequency $f_A$;
an ancillary oscillator emitting an auxiliary frequency $f_H$ of the same order of magnitude as said output frequency $f_A$, said ancillary oscillator being provided with a second phase-locking loop including control means coupled with said first selection means for varying said auxiliary frequency $f_H$ in the same relatively large increments as said output frequency $f_A$;
mixer means connected to the output terminal of said main oscillator and to a corresponding terminal of said ancillary oscillator for generating a difference frequency $f_D = f_A - f_H$;

a frequency discriminator connected to said mixer means for converting said difference frequency $f_D$ into a corrective voltage; and circuit means feeding said corrective voltage to said control input over an impedance path bypassing said filter network for suppressing noises due to phase differences occurring at said filter network and varying at frequencies beyond the limiting frequency of said filter network.

4. A system for generating a digitally tunable high-frequency oscillation, comprising:

a main oscillator having a control input and an output terminal for producing a high output frequency $f_A$;

a first phase-locking loop connected between said output terminal and said control input;

a phase discriminator in said phase-locking loop with a first input connected to a source of a relatively low comparison frequency, a second input connected to said output terminal via a step-down circuit converting said output frequency $f_A$ into a feedback frequency matching said comparison frequency, and a voltage output connected to said control input via a filter network whose limiting frequency varies monotonically with the output voltage of said phase discriminator;

first selection means coupled to one of the inputs of said phase discriminator through a frequency divider for modifying the frequency applied thereto in coarse-tuning steps corresponding to relatively large increments of said output frequency $f_A$;

second selection means coupled through a switching network and said frequency divider to one of the inputs of said phase discriminator for modifying the frequency applied thereto in fine-tuning steps corresponding to relatively small increments of said output frequency $f_A$;

an ancillary oscillator emitting an auxiliary frequency $f_H$ of the same order of magnitude as said output frequency $f_A$, said ancillary oscillator being provided with a second phase-locking loop including control means coupled with said first selection means for varying said auxiliary frequency $f_H$ in the same relatively large increments as said output frequency $f_A$;

mixer means connected to the output terminal of said main oscillator and to a corresponding terminal of said ancillary oscillator for generating a difference frequency $f_D = f_A - f_H$;

a frequency discriminator connected to said mixer means for converting said difference frequency $f_D$ into a corrective voltage; and circuit means feeding said corrective voltage to said control input over an impedance path bypassing said filter network for suppressing noises due to phase differences occurring at said filter network and varying at frequencies beyond the limiting frequency of said filter network, said impedance path including a blocking capacitor in series with a resistor.

5. A system as defined in claim 4 wherein said circuit means includes a threshold device connected to the junction of said blocking capacitor with said resistor for shunting high voltage peaks to ground.

6. A system as defined in claim 4 wherein said impedance path includes an integrating operational amplifier having a noninverting input connected to said resistor and an inverting input connected to said filter network.

7. A system as defined in claim 4, further comprising a subtractor connected between said mixer means and said blocking capacitor for diminishing said corrective voltage by a compensating voltage obtained from said second selection means, said compensating voltage being substantially proportional to any small-increment variation of said output frequency $f_A$.

8. A system as defined in claim 4 or 5 wherein said step-down circuit comprises a first frequency divider and said control means comprises a second frequency divider.

9. A system as defined in claim 8 wherein said first frequency divider is coupled with said first selection means for concurrent adjustment with said second frequency divider but with a step-down ratio differing from that of said second frequency divider by a constant value.

10. A system as defined in claim 9 wherein said source of comparison frequency comprises a third frequency divider between said ancillary oscillator and said first input, said first and third frequency dividers having the same constant step-down ratio.

11. A system as defined in claim 4 or 5 wherein said mixer means forms part of said step-down circuit, said second input being connected to receive said difference frequency from said mixer means.

12. A system as defined in claim 4 or 5 wherein said step-down circuit comprises a frequency divider settable by said first selection means, said second phase-locking loop including a sampling gate driven by a constant reference frequency identical with said comparison frequency and connected between an output of said ancillary oscillator and said control means.

13. A system as defined in claim 12 wherein said control means comprises a source of upper and lower presetting voltages responsive to said corrective voltage from said frequency discriminator for adjusting said ancillary oscillator to a frequency range determined by said first selection means.

* * * * *